United States Patent
Litvak et al.

(10) Patent No.: US 8,872,677 B2
(45) Date of Patent: Oct. 28, 2014

(54) METHOD AND APPARATUS FOR COMPRESSING DATA-CARRYING SIGNALS

(71) Applicant: Dialogic Networks (Israel) Ltd., Petach Tikva (IL)

(72) Inventors: Oleg Litvak, Ariel (IL); Amir Ilan, Hod Hasharon (IL)

(73) Assignee: Dialogic Networks (Israel) Ltd., Petach Tikva (IL)

( * ) Notice: Subject to any disclaimer, the term of this patent is extended or adjusted under 35 U.S.C. 154(b) by 0 days.

(21) Appl. No.: 13/838,327

(22) Filed: Mar. 15, 2013

(65) Prior Publication Data
US 2014/0266816 A1    Sep. 18, 2014

(51) Int. Cl.
*H03M 7/34*    (2006.01)
*H03M 7/30*    (2006.01)

(52) U.S. Cl.
CPC ........................ *H03M 7/30* (2013.01)
USPC ................. 341/51; 341/65; 341/67; 341/106; 375/240.25; 375/240.01; 713/177; 713/185; 713/193; 370/477; 370/486; 382/232; 382/245; 382/128; 382/209; 382/239; 711/137; 711/213; 711/E12.057

(58) Field of Classification Search
CPC ........... H03M 7/00; H03M 7/40; H03M 7/42; H03M 7/46; H03M 7/3082; H03M 7/3086; H03M 7/3088; H03M 3/02; H04N 7/12; H04N 7/24; H04N 1/41; H04N 1/413; H04B 10/90; H04B 17/00; H04B 11/00; H04J 3/18; H04L 1/00; G06F 17/30; G06F 17/2735; G06F 17/30985; G06F 12/0862; G06F 19/323; G06T 9/005; G06Q 20/346; A61B 6/03; A61B 6/032; A61B 6/563

USPC ............ 341/51, 67, 106; 375/240.25, 240.01; 713/177, 185, 193; 370/477, 486; 382/232, 245, 128, 209, 239, 244, 246; 711/137, 213, E12.057
See application file for complete search history.

(56) References Cited

U.S. PATENT DOCUMENTS

| | | | |
|---|---|---|---|
| 5,710,562 A | * | 1/1998 | Gormish et al. ............... 341/107 |
| 5,761,676 A | * | 6/1998 | Wood et al. ........................... 1/1 |
| 5,936,560 A | | 8/1999 | Higuchi |
| 6,172,987 B1 | * | 1/2001 | Razazian et al. .............. 370/468 |

(Continued)

OTHER PUBLICATIONS

Ziv, J., Lempel, A., A Universal Algorithm for Sequential Data Compression, IEEE Transactions on Information Theory, vol. IT-23, May 1977.

(Continued)

*Primary Examiner* — Lam T Mai
(74) *Attorney, Agent, or Firm* — Chapin IP Law, LLC

(57) ABSTRACT

A compression method applies a selection rule to input symbols and generates a reduced partial set of symbols. The partial set is checked against a dictionary-index for a match. A match identifies a range of matching symbols in a dictionary. The length of the matching range is iteratively increased by checking previous and next symbols in the input data and the dictionary until a matching range length meets a threshold limit or the length of the matching range cannot be increased further. Compressed data corresponding to the input symbols is provided where input symbols are copied over and symbols in a matched range of data are replaced with a representation of their corresponding start location and length in the dictionary.

60 Claims, 7 Drawing Sheets

(56) References Cited

U.S. PATENT DOCUMENTS

| | | | |
|---|---|---|---|
| 6,453,389 B1* | 9/2002 | Weinberger et al. | 711/137 |
| 6,597,812 B1* | 7/2003 | Fallon et al. | 382/232 |
| 6,668,092 B1* | 12/2003 | Sriram et al. | 382/244 |
| 7,085,020 B2* | 8/2006 | Trelewicz | 358/426.13 |
| 7,245,769 B2* | 7/2007 | Temizel et al. | 382/233 |
| 8,184,691 B1* | 5/2012 | Henson et al. | 375/240.02 |
| 8,254,210 B2* | 8/2012 | Peacock et al. | 367/131 |
| 8,605,963 B2* | 12/2013 | Gering et al. | 382/128 |

OTHER PUBLICATIONS

Deutsch, P., Deflate Compressed Data Format Specification Version 1.3, Aladdin Enterprises, May 1996.

.Zip File Format Specification, Pkware Inc. 1989-2012.

* cited by examiner

METHOD AND APPARATUS FOR COMPRESSING DATA-CARRYING SIGNALS

STATEMENT REGARDING FEDERALLY SPONSORED RESEARCH OR DEVELOPMENT

N/A

FIELD OF THE INVENTION

The present invention relates, in general, to communication systems and more specifically, to methods and apparatus for performing compression and recovering compressed data transmitted in such systems.

BACKGROUND OF THE INVENTION

Digital networks now carry voice, facsimile, data and video signals. With this vast amount of data being exchanged, data compression is used in these networks to increase efficiency by transmitting the signals in a compressed form. The cost and time savings are significant and thus highly desirable. This in turn has resulted in a continual demand for improved data compression algorithms and techniques.

Data compression is an operation where a signal, e.g., computer data, that requires a certain number of bits, is represented, or encoded, using fewer bits overall. The ratio between the number of bits required for representing the original signal versus the number of bits required by the encoded signal is generally known as the compression ratio. The complimentary process in which the compressed and encoded signal is expanded and reconstructed to form its original representation is generally known as either decompression, decoding or reconstruction.

Data compression techniques have been refined over time and now include primarily two types of compression: lossy and lossless. In a lossy compression system, portions of the data that are determined to be less necessary than others are discarded, making exact reconstruction, or decompression, of the signal impossible. Accordingly, lossy compression is usually employed, for example, in connection with signals such as speech, audio, images and video in which exact reconstruction of the original signal is usually not required for to be acceptable. Moreover, since these types of signals are generally destined for human perception, such as by the human auditory or visual senses, minor differences between the original and reconstructed signals may either be undetectable by human senses or the slightly degraded signal can be tolerated.

In contrast, lossless compression enables an exact reconstruction of the original signal performed upon decompression and can achieve a perfect recreation of the original signal without the degraded or compromised characteristics of lossy compression techniques. One of the consequences of employing lossless compression, however, is that the compression ratio, or the ability to compress a large number of data bits into a smaller number of data bits, is greatly reduced. Despite this, for certain types of data information, it is imperative that perfect reconstruction of lossless data compression be employed rather than the compromised reconstruction approach characteristic of lossy compression techniques. For example, computer data, such as an executable file, must be precisely reconstructed the file is not likely to execute properly. Similarly, if important data is being transmitted, the failure to precisely reconstruct the transmitted data is likely to lead to the loss of at least some of the transmitted data.

At present, various entropic compression methods and pre-compression transformations exist. The existing lossless compression algorithms are typically categorized according to their approach to extract predictive information and/or repetitive patterns embedded in the signal, e.g., repetition of patterns, and the methods used to efficiently encode the information.

Typically, lossless compression algorithms encode the source information in a more compact and optimized way using global statistics and information.

While utilizing lossless compression techniques for communication purposes, optimized encoding is achieved by using information embedded in the previously transmitted data. However, the encoder and decoder must retain synchronization therebetween regarding the transmitted/received data used to encode/decode that data, in order for such applications to operate successfully.

Two famous two lossless data compression algorithms, LZ77 and LZ78, were described by A. Lempel and J. Ziv in 1977 and 1978, respectively. These two algorithms are both dictionary coders. LZ77 is the sliding window compression algorithm, which was later shown to be equivalent to the explicit dictionary compression technique of LZ78—however, these two algorithms are only equivalent when the entire data is intended to be decompressed. LZ78 decompression allows random access to the input as long as the entire dictionary is available, while LZ77 decompression must always start at the beginning of the input.

Based on these algorithms, upon arrival of a data-containing stream, its compression may be achieved by detecting known combinations in the form of strings, data blocks, etc., and replacing them with their respective coordinates in a dictionary that the receiving side also uses. By following this method, i.e., where the detected combinations are removed in their entirety from the arriving data stream and only their coordinates (pointers) are conveyed, a compression of the arriving data stream is achieved.

Many methods have been suggested in order to establish an appropriate pointer for the detected data blocks. One such method, for example, relies on the fact that in a certain data stream one is likely to find a repetition of data. Therefore, a typical solution would be to use a history of the data as a dictionary for the yet arriving data. U.S. Pat. No. 5,936,560 discloses such a solution wherein a dictionary window is used for comparing a stored history of data with data to be compressed, and, when a data match is found, a code, e.g., a pointer, indicating a length of the data match and a code indicating a relative position of data in the dictionary window that produced the data match, are generated. In the comparison, there are m groups of data in the is dictionary window, each of the m groups includes a total of n data, that are compared substantially simultaneously with a total of n data in the data to be compressed, where m=2, 3, . . . and n=2, 3, . . . , and the compressed data is generated by encoding the data that produced the longest data match.

P. Deutsch in "DEFLATE Compressed Data Format Specification version 1.3", RFC 1951, Network Working Group, 1996 suggested a lossless compressed data format that compresses data using a combination of the LZ77 algorithm and Huffman coding. The data can be produced or consumed, even for an arbitrarily long sequentially presented input data stream, using only an a priori bounded amount of intermediate storage.

In typical known solutions, for every byte that arrives, one needs to calculate and store a hash function, so that when an identical byte arrives its hash function is calculated and used while retrieving the required pointer from a hash table. The best match is declared when the highest number of consecutive matching bytes is detected. One of the major drawbacks of such a mechanism is that for every entry in the dictionary (irrespective of how this dictionary was constructed) it is necessary to calculate and to store a corresponding hash function, and to do that also for the newly arriving data. Therefore, not only does this mechanism require substantial computational resources it also requires a substantial amount of storage capacity to cope with the above requirements.

What is needed, therefore, is a way to increase the efficiency of the compression, reduce the amount of required calculations as well as reduce the amount of required storage capacity for the hash table.

BRIEF SUMMARY OF THE INVENTION

In one embodiment of the present invention, a computer implemented compression method selects a subset of input data symbols in a defined block of input data symbols according to a first predetermined selection rule. A respective input data dictionary-index value is generated for the selected subset. If the input data dictionary-index value represents a range of dictionary data symbols stored in a dictionary, then a determination is made of a range of input data symbols including the subset of input data symbols that matches a range of dictionary data symbols that includes the range of dictionary data symbols; and a correlation of the matching input data range of symbols and the dictionary data range of symbols is stored as a set comprising a pointer to a starting symbol location in the dictionary and a matching range length. This is repeated until an end of the defined block of input data symbols is reached; and the defined block of input data symbols is converted into an outgoing data payload by replacing those input data symbols determined to be in a matching range of symbols in the dictionary with an indication of the stored corresponding pointer and matching range length.

In one embodiment of the present invention, a computer implemented compression method is applied to an input data block of bytes and includes applying a hash function to every Nth byte. A hash index is checked to determine if there is an entry in the hash index that has the same value as any of the generated hash values. The hash index points to byte locations in a history buffer for which a hash value has been similarly calculated. If there is a match, then some range of bytes in the history buffer matches a range of bytes in the input data block. The method then attempts to expand the length of the matching ranges by iteratively checking the adjacent previous and next bytes in the input data block with the adjacent previous and next bytes in the history buffer. Once a matching string length meets a threshold limit or the length of the matching range cannot be lengthened, whichever occurs first, then the next Nth byte is chosen and the foregoing steps are repeated. Once the data block has been analyzed then, in the order received in the input data block, those bytes that could not be matched to the history buffer are sent as received and those bytes in matching ranges are replaced with a representation comprising a starting point and length of a range of bytes in the history buffer.

In another embodiment of the present invention, a computer-implemented method of compressing a sequence of input data symbols, includes generating a respective input data dictionary-index value $DI_N$ for a subset of input data symbols $S_N$ in the sequence of input data symbols selected according to a first predetermined selection rule. Then, for each input data dictionary-index value $DI_N$: searching a dictionary-index for an entry corresponding to each input data dictionary-index value $DI_N$, where each dictionary-index entry points to a range of dictionary data symbols D and a corresponding location in a dictionary; if the input data dictionary-index value $DI_N$ is found in the dictionary-index then determining a range of input data symbols including the subset $S_N$ that matches a range of dictionary data symbols $D_N$; and storing the correlation of the matching input data range of symbols and the dictionary data range of symbols as a set comprising a pointer to a starting symbol location in the dictionary and a matching range length. Further, for each input data symbol of the sequence of input data symbols: inserting the input data symbol into an outgoing data payload if the input data symbol is not in a range of matching symbols in the dictionary; and for those input data symbols in a is matching range of symbols in the dictionary then inserting an indication of the stored corresponding pointer and matching range length in the outgoing data payload instead of the input data symbols.

BRIEF DESCRIPTION OF THE SEVERAL VIEWS OF THE DRAWINGS

Embodiments of the present invention may be better understood by referring to the following description in conjunction with the accompanying drawings in which.

DETAILED DESCRIPTION OF THE INVENTION

Embodiments of the present invention are related to the field of data transmission via a communication network and an implementation of data compression for reducing the quantity of transmitted data using a dictionary and a dictionary-index.

Advantageously, embodiments of the present invention reduce the number of updates to a dictionary-index that are needed by providing updates only for selected symbols in the input stream and not for each input data symbol. As a result, the size of the dictionary-index is reduced. As will be discussed in more detail below, the reduction is accomplished by selecting a first reduced partial set of symbols for updating the dictionary-index.

Further, the number of comparisons that need to be performed is reduced by implementing a comparison by only looking at a second reduced partial set of symbols of the input stream of data that is being compressed.

In one embodiment of the present invention, first and second reduced partial sets are is defined by selecting A symbols every N and M symbols in the data stream and the dictionary, respectively, wherein the coefficients N and M are relatively prime ones, i.e., they do not share a common factor. The symbols are selected from the data stream and the dictionary according to the same selection rule. As a result, embodiments of the present invention reliably find locations of equal data in the dictionary for pieces of data that are M×N and larger. In addition, shorter pieces of data that match data already transmitted may also be found.

Further, and as will be discussed in more detail below, combinations of compressed and non-compressed intervals of input data are provided for transmission to a receiving end of a communication link. Once received, the method includes parsing of the compressed block at the decompressor and replacement of compressed intervals with the appropriate symbols or symbols from the local history buffer located at the receiving end. While a "symbol" may be a more general reference to a data unit, in one embodiment of the present invention, a symbol may be a byte. The invention, however, is not limited to using bytes as the data unit and the appended claims should not be limited to such an interpretation unless recited therein.

Figure 1:
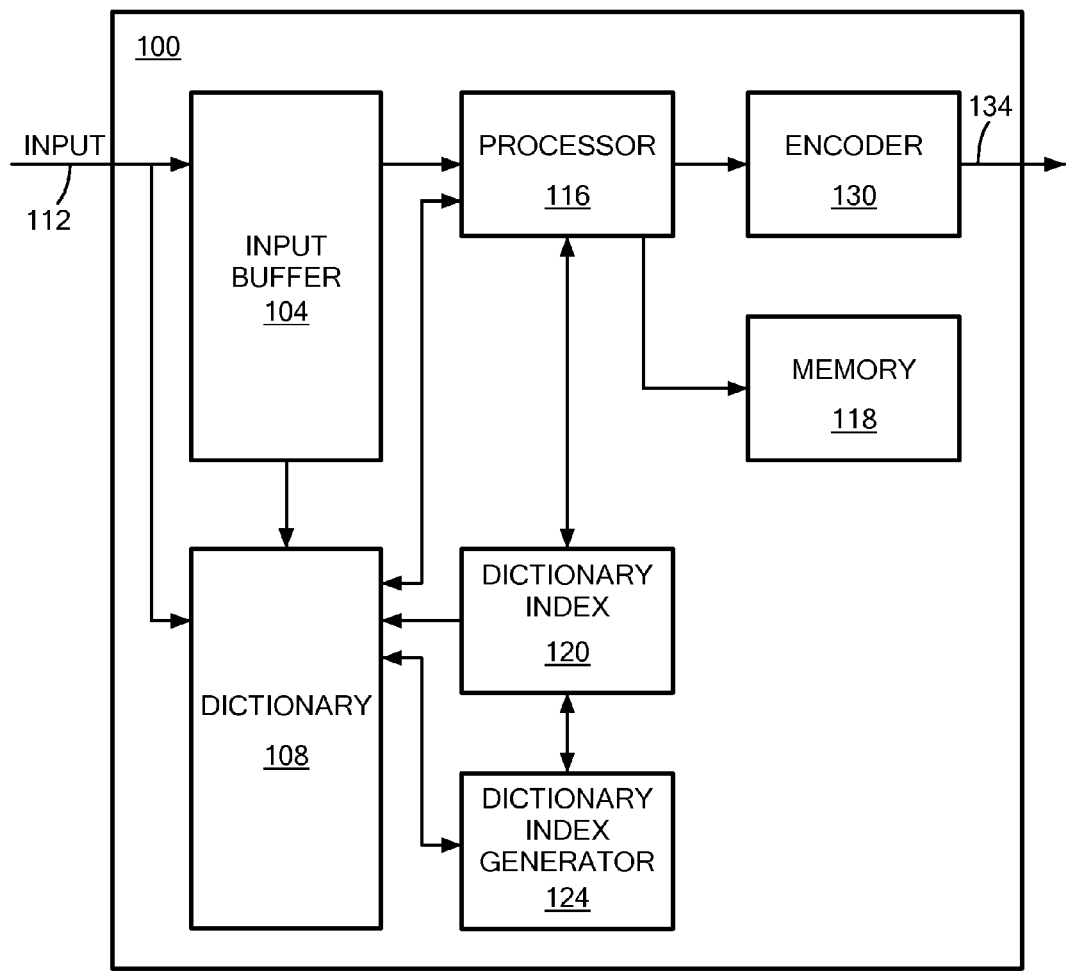
FIG. 1 is a block diagram of a computer implemented compressing system in accordance with an embodiment of the present invention.

Referring now to FIG. 1, a compressing device 100 according to an embodiment of the present invention includes an input buffer 104 and a dictionary 108, each of which is coupled to a data input line 112. The dictionary 108 may be implemented as a buffer being operated as a FIFO queue. Of course, one of ordinary skill in the art will understand that there are other combinations of devices and operations that can be used to implement the dictionary 108 in accordance with the teachings herein and the claims are not intended to be limited to only this embodiment.

A processor 116 is coupled to the input buffer 104 and the dictionary 108 and to a dictionary index 120. A memory 118 is coupled to the processor 116 to store instructions that are executed by the processor. These instructions may include those necessary to perform the methods in accordance with the various embodiments of the present invention described herein. The dictionary index 120 is also coupled to the dictionary 108 and to a dictionary index generator 124 that is also coupled to the dictionary 108. The dictionary index 120 provides "pattern indexing" to implement pattern searching within the dictionary 108. An encoder 130 is coupled to the processor 116 and to an output line 134 on which compressed and non-compressed data is provided. The operation of the compressing device 100 will be discussed in more detail below.

Figure 6:
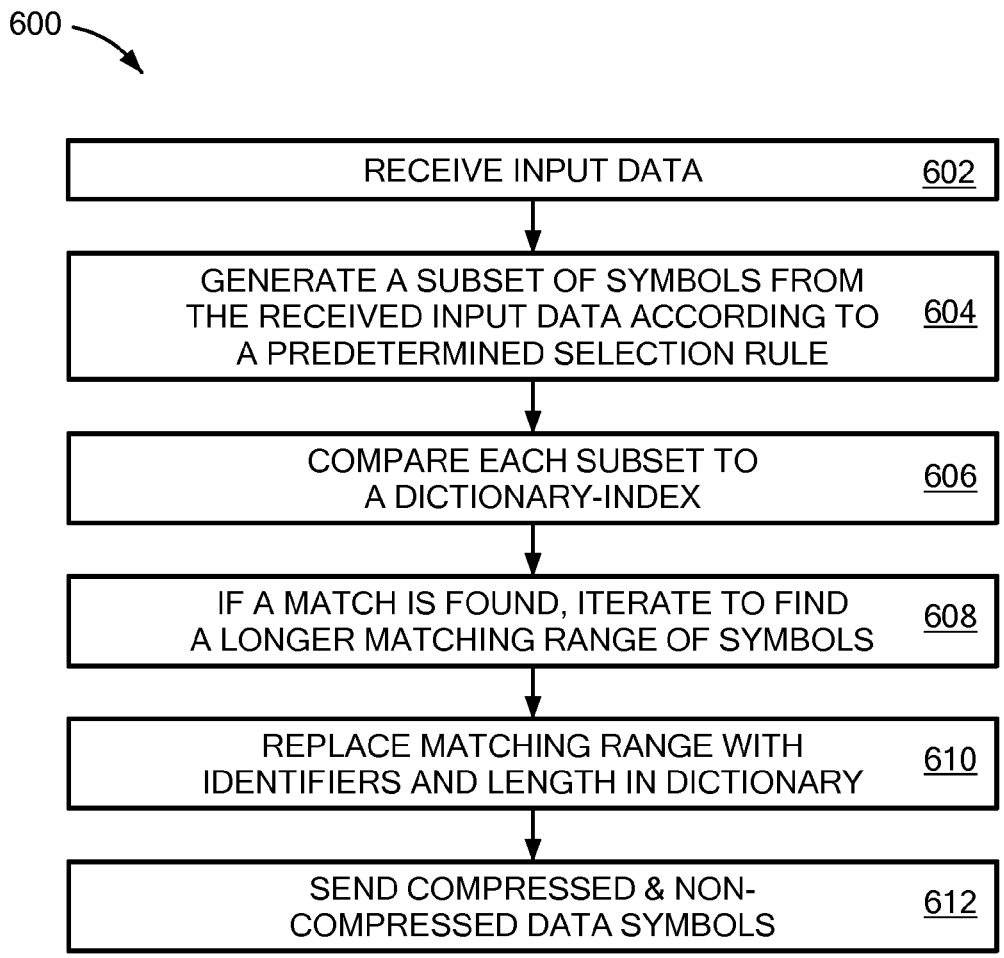
FIG. 6 is an overview of a method of compressing data in accordance with embodiments of the present invention.

Prior to describing one embodiment, an overview of operation of the compressing method, referring to FIG. 6, will be described. A method of compressing data includes receiving is input data symbols, step 602, and then generating a subset of symbols from the received input data symbols according to a predetermined selection rule, step 604. Next, each generated subset of symbols is compared to a dictionary-index to determine if there is a matching set of data in a dictionary, step 606. If a match is found, step 608, then an iterative process is performed about the subset of input data symbols to find a longer matching range of symbols in the dictionary. At step 610, the input data symbols found to be in a matching range in the dictionary are replaced with an identification of the location and length of the matching range in the dictionary. At step 612, the compressed and non-compressed input data symbols are forwarded. The details of embodiments of the present invention will be described in more detail below.

Figure 2A:
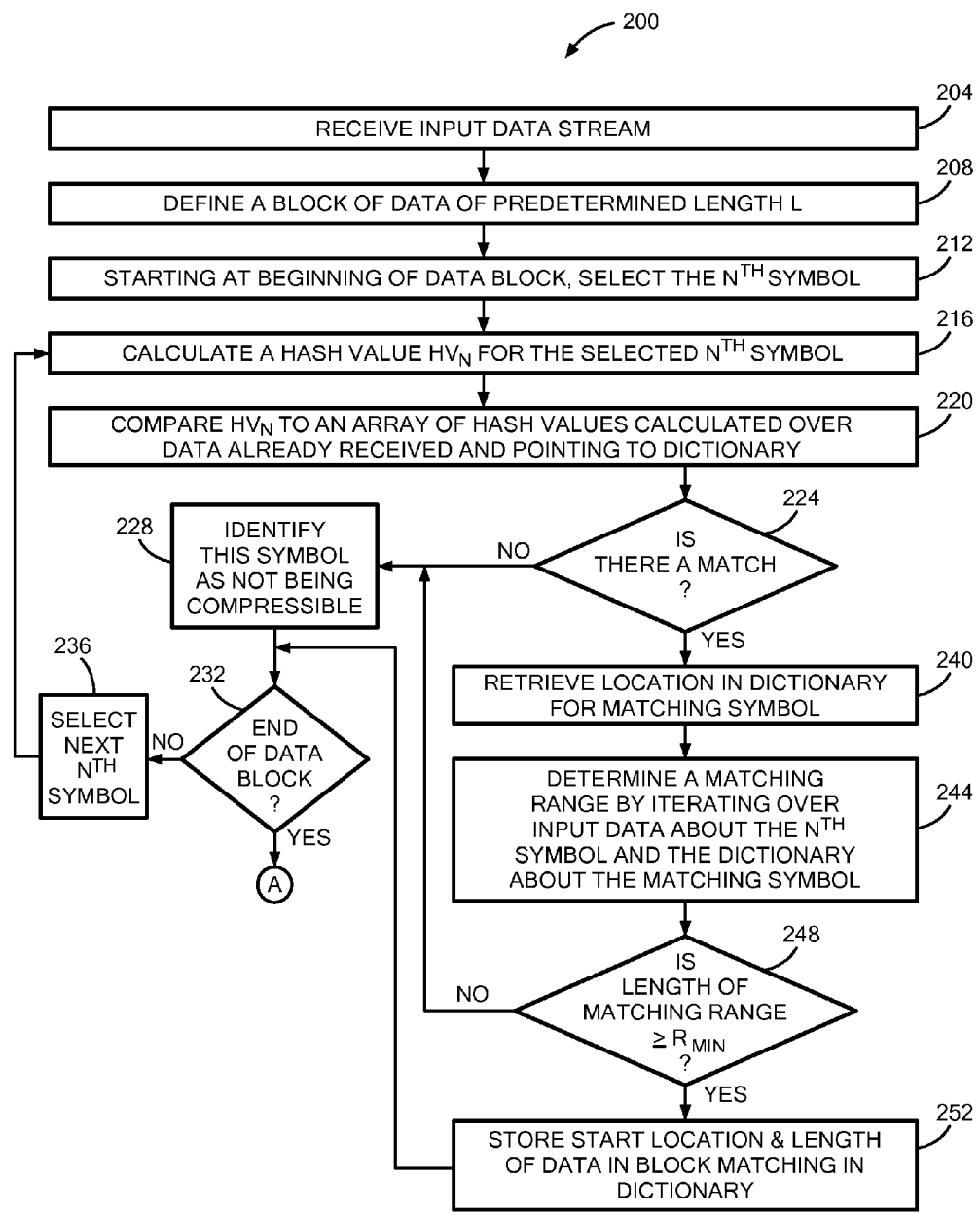
FIGS. 2A and 2B represent a flowchart in accordance with an embodiment of the present invention.
Figure 2B:
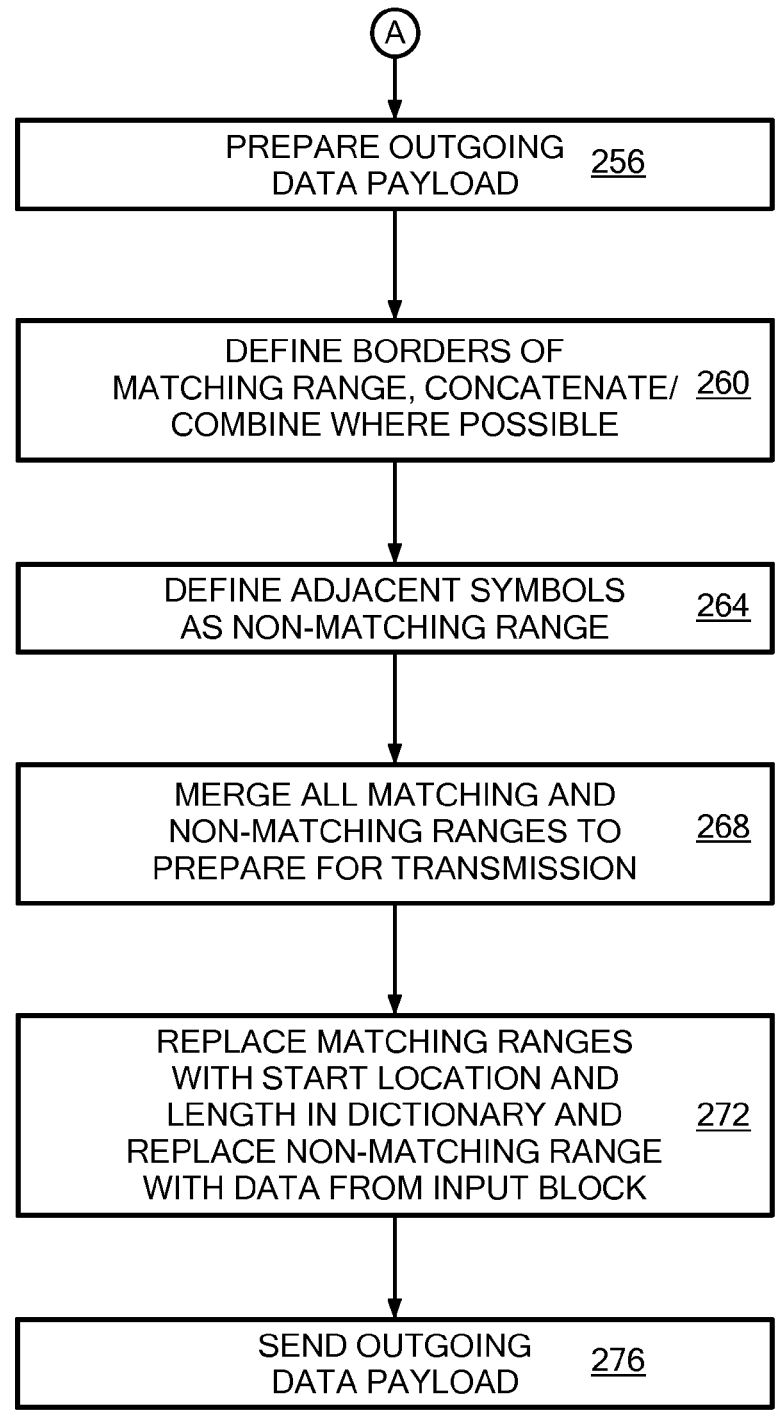

Referring to FIGS. 2A and 2B, a method 200 in accordance with one embodiment of the present invention will now be described. Generally, the method 200 is performed within the processor 116 by executing a program stored in the memory 118.

At step 204, an input data stream is received on the data input line 112 and stored in each of the input buffer 104 and the dictionary 108. Subsequently, step 208, a block of data of predetermined length L is defined. It should be noted that this is only an example of an embodiment of the present invention and is described with respect to a block of data merely for purposes of explanation. The teachings of the invention, however, are not limited to blocks of data, such as those blocks of data associated with a particular mode of transmission, for example, packet switched communications. It is intended that embodiments of the present invention are applicable to both "block-based" data transmission schemes as well as the transmission of "streaming data."

In an embodiment described herein, the dictionary-index 120 implements pattern searching as a hash table including a plurality of entries, where each entry comprises a hash chain. One of ordinary skill in the art will understand that there are other methods of pattern searching aside from using hashes and a hash table. These other combinations of devices and operations can be used to implement the dictionary-index 120 in accordance with the teachings herein and the claims are not intended to be limited to only this embodiment.

At step 212, starting at the beginning of the data block, i.e., the first received data symbol, the $N^{th}$ symbol is selected. At step 216, a hash value $HV_N$ for the selected $N^{th}$ symbol is calculated. In one non-limiting embodiment of the present invention, the hash function is a CRC of the $N^{th}$ symbol and the previous ten symbols. Of course, one of ordinary skill in the art will understand that there is a number of different hash functions that could be used to generate a hash value within the teachings of the present invention.

At step 220, the calculated hash value $HV_N$ is compared to an array of hash values that have been calculated over data that has already been sent and which is stored in the dictionary 108. The array of hash values are stored in the dictionary index 120.

The dictionary index 120 comprises a plurality of entries where a hash value that has already been calculated for a specific symbol in the dictionary points to a location of that specific symbol. The details of the creation of the dictionary index 120 will be described in more detail below. Thus, each entry in the dictionary index 120, i.e., each hash value, points to a specific location in the dictionary 108. The operations of dictionary indices and dictionaries are well known to those of ordinary skill in the art and will not be otherwise described in detail except to explain aspects of embodiments of the present invention. At step 224, a determination is made as to whether or not the calculated hash value $HV_N$ is found in the dictionary index 120. If no match is found, then control passes to step 228 where this selected $N^{th}$ symbol is identified as not being compressible, i.e., a sequence of data corresponding to the calculated hash value has not been identified in the dictionary index 120 as being in the dictionary. At step 232, a determination is made as to whether there is more data in the block defined at step 208 that needs to be processed. If it is not the end of the data block then, at step 236, the next $N^{th}$ symbol is selected and control passes to step 216.

In another embodiment, every $N^{th}$ symbol, i.e., N, 2N, 3N, etc., could be identified and corresponding hash values $HV_N$, $HV_2N$, $HV_3N$, etc., calculated as a group and then each be checked against the dictionary index.

Returning now to step 224, if there is a match of the calculated hash value $HV_N$ to a value in the dictionary index 120, control passes to step 240 where the location in the dictionary is retrieved from the dictionary index 124 for the matching hash value $HV_N$.

A matching range is then determined by iterating over the input data about, i.e., including, the $N^{th}$ symbol and in the dictionary about the symbol that is pointed to in the dictionary index 120, at step 244.

As an example only, assume that N=15 and it determined that the hash value of the 15$^{th}$ symbol, i.e., a "target" symbol, is found in the dictionary index 120 and points to the 64$^{th}$ symbol in the dictionary 108. Further, as the hash function is based on the target symbol and the previous ten symbols, eleven symbols total, by definition it would appear that the 5th through 15th symbols of the input block are a match to the 54th to 64th symbols in the dictionary. The is iteration occurs by trying to lengthen or extend the matching range of symbols by "appending" symbols or sliding the range of symbols. So, for example, the method tests the symbols from the 4$^{th}$ through the 15$^{th}$ symbols (12 symbols in length) of the input block to see if they match the 53rd to 64th symbols or the 54$^{th}$ to 65$^{th}$ symbols (each also 12 symbols in length) in the dictionary and then check to see if, perhaps, the 5$^{th}$-16$^{th}$ symbols of the input data match the 53$^{rd}$-65$^{th}$ symbols in the dictionary. This process continues until either there are no matches at the "ends" of the ranges, i.e., the matching range cannot be extended, or the length of the matching range is greater than or equal to a predetermined effective threshold value $R_{EFF}$.

The predetermined effective threshold value $R_{EFF}$ is used to increase the efficiency of the method. As there is a tradeoff between incurring the processing time needed to determine the longest matching string of data and the benefits of compression, once a matching string with a length that meets the predetermined threshold value $R_{EFF}$ is found, it is not necessary to continue analyzing as the compression gained does not justify the additional processing incurred.

Conversely, if the length of the matching range is less than some predetermined minimum, then it is set as not matching. So, at step 248 the length of the matching range is compared to a predetermined minimum length $R_{MIN}$. If greater than or equal to predetermined minimum length $R_{MIN}$, control passes to step 252 where the start location and length of the matching range is temporarily stored for the corresponding range of input data symbols.

Thus, in the example, if it is determined that the 4th through 16th symbols of the input data block match symbols 53-65 in the dictionary then that information would be stored for later processing as discussed below. Subsequent to operations in step 252, control passes to step 232 for continuation of the process 200 as described above.

If, however, in step 248 the matching range is not greater than or equal to the predetermined threshold $R_{MIN}$, then control passes to step 228 for processing as set forth above.

Returning now to step 232, if it is determined that it is the end of the data block then control passes to step 256 where an outgoing compressed data payload corresponding to the input data block is prepared. In the outgoing compressed data payload, matched ranges of data are replaced with a representation of their corresponding start location and length in the dictionary otherwise the data symbols are copied over.

Preparing the outgoing compressed data payload includes identifying and defining the borders of the matching ranges and then concatenating and/or combining where possible, step 260. Thus, the data stored at steps 228 and 252 is used to represent the symbols in the block of is data established in step 208. As a result, in accordance with embodiments of the present invention, symbols will either be represented as their non-compressed values or a range of symbols will be replaced by a representation of a starting location in the dictionary 108 and a length of symbols for which a match has been determined. At step 264, adjacent symbols, i.e., those adjacent to a pointer and a length, are defined as a non-matching range of symbols and subsequently, step 268, all matching and non-matching ranges are merged to prepare for transmission, step 268.

As set forth above, the matching ranges are replaced with start location and length values pointing to those locations in the dictionary and non-matching range are replaced with data from the input block, step 272.

The output compressed data payload, again, consisting of data from the input block and/or start location and length information is sent in step 276. It should be noted that the outgoing compressed data payload can be sent by any known transmission protocol and the choice of which is not germane to the present invention.

Figure 3:
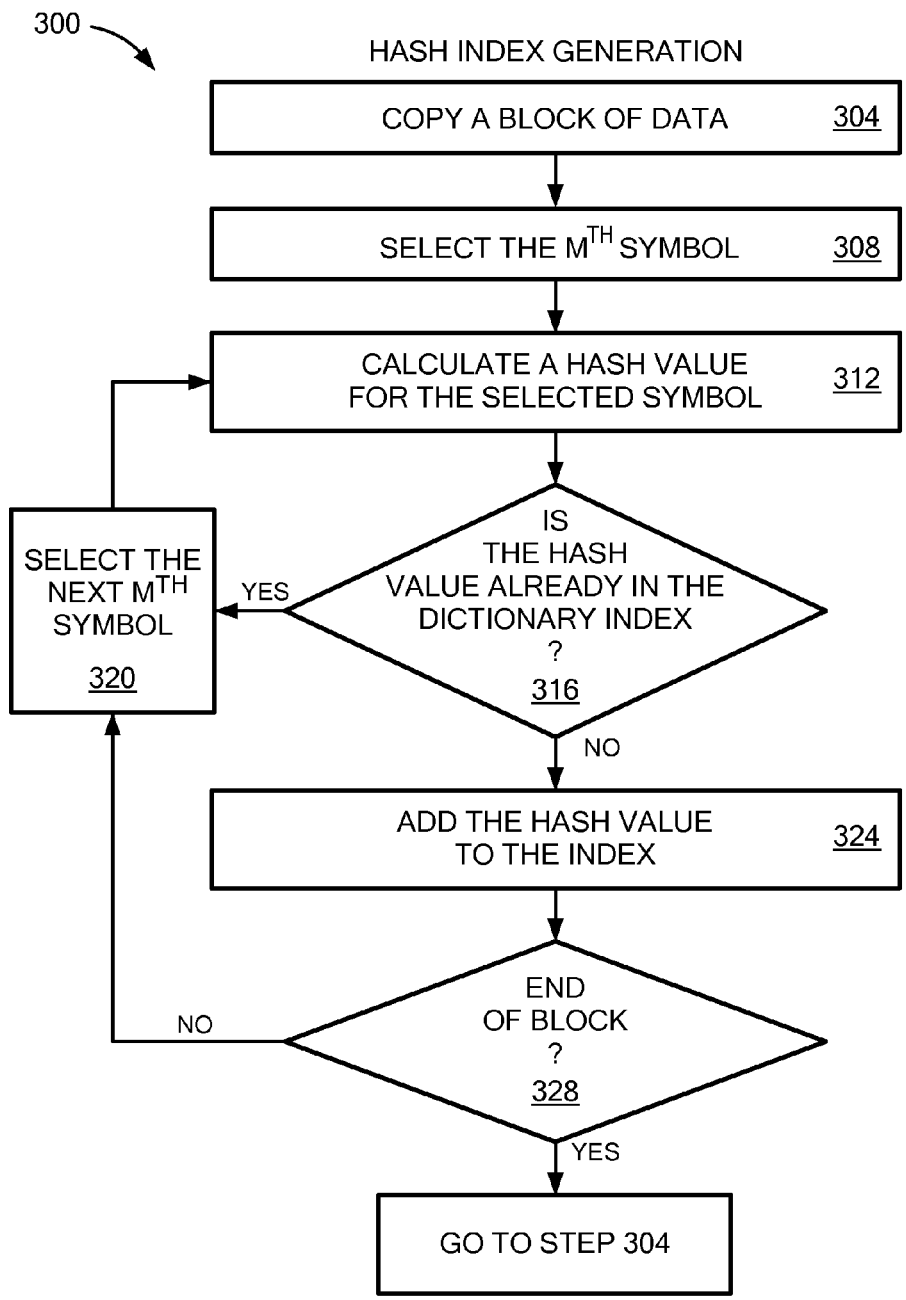
FIG. 3 is a block diagram of a method of creating a hash index in accordance with an embodiment of the present invention.

Referring now to FIG. 3, a method 300 for populating the dictionary index 120 starts at step 304 where a next block of data to be placed in the dictionary 108 is copied. At step 308, the M$^{th}$ symbol is selected, for example M=16, and a hash value for the selected M$^{th}$ symbol is calculated at step 312. It should be noted that the hash function applied to the input data in step 216 is the same as the hash function used to calculate the index values in step 312. The value of M is chosen so that it is relatively prime with respect to the value N as used in the compression method 200 described above. In the present application, relatively prime means that the values M, N do not share a common factor as in the present example, where N equals 15 and M equals 16. At step 316, the hash value calculated in step 312 is compared to the hash values already stored in the dictionary index 120. If there is a match then control passes to step 320 where the next M$^{th}$ symbol, if there are more symbols in the block, is chosen and control passes then to step 312.

Returning now to step 316, if the calculated hash value is not found in the dictionary index then control passes to step 324 and an entry is added to the index consisting of the calculated hash value and a pointer to the location in the dictionary 108. In one embodiment, the newest entry is placed at the top, or the beginning, of the array. Placing the newest indices at the beginning, and starting the searches at the beginning, may provide increased efficiencies as matching data may occur in localized groups and a match may be identified sooner by placing the new entries at the beginning.

Subsequently, step 328, a determination is made as to whether this is the end of the block and if it is not, then control passes to step 320. If it is the end of the block then control passes to step 304 to process a next block of data.

Figure 4:
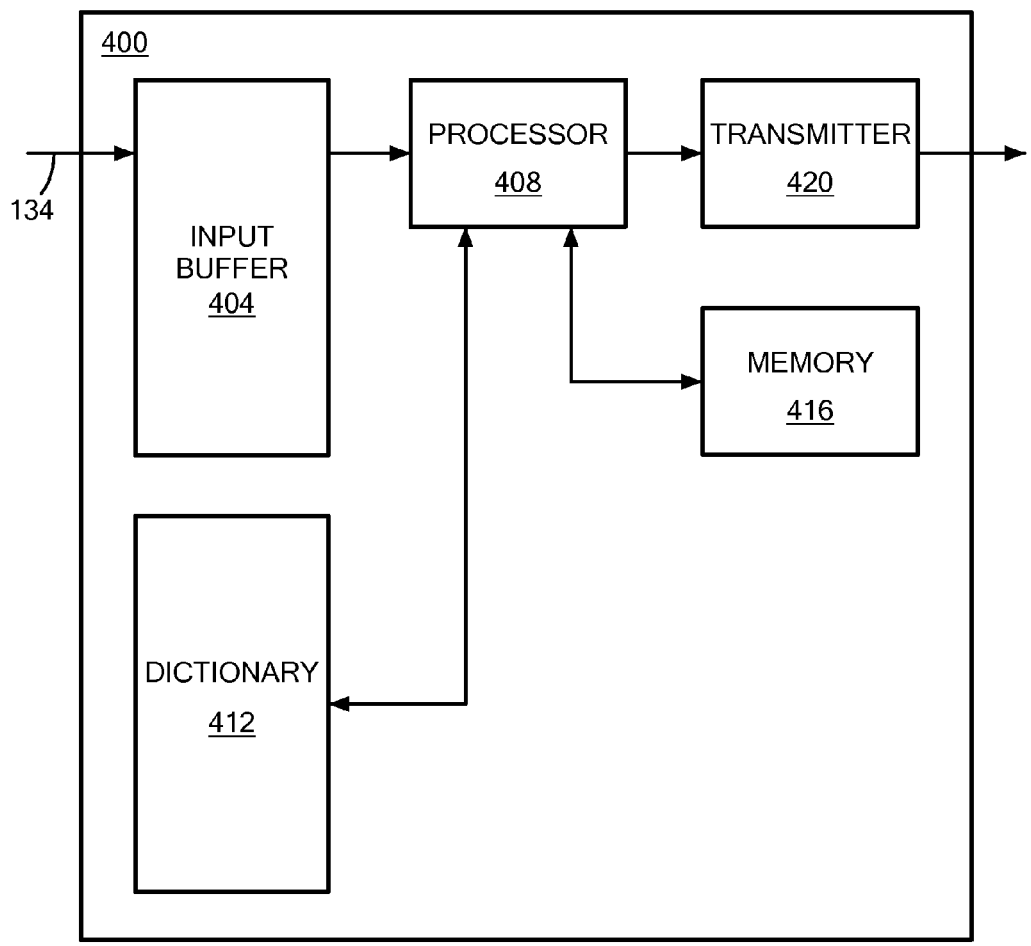
FIG. 4 is a block diagram of a computer-implemented decompressing system in accordance with an embodiment of the present invention.

Referring now to FIG. 4, a decompressing device 400 comprises an input buffer 404 coupled to the transmission line 134. A processor 408 is coupled to an output of the input buffer 404 and a dictionary 412. The dictionary 412 may also be implemented as a buffer being operated as a FIFO queue. Of course, one of ordinary skill in the art will understand that there are other combinations of devices and operations that can be used to implement the dictionary 412 in accordance with the teachings herein and the claims are not intended to be limited to only this embodiment. A memory 416 is coupled to the processor 408 and may contain program code for execution of a decompressing method by the processor 408, as will be described below. A transmitter 420 is coupled to the processor 408 to transmit decompressed data to a destination.

Figure 5:
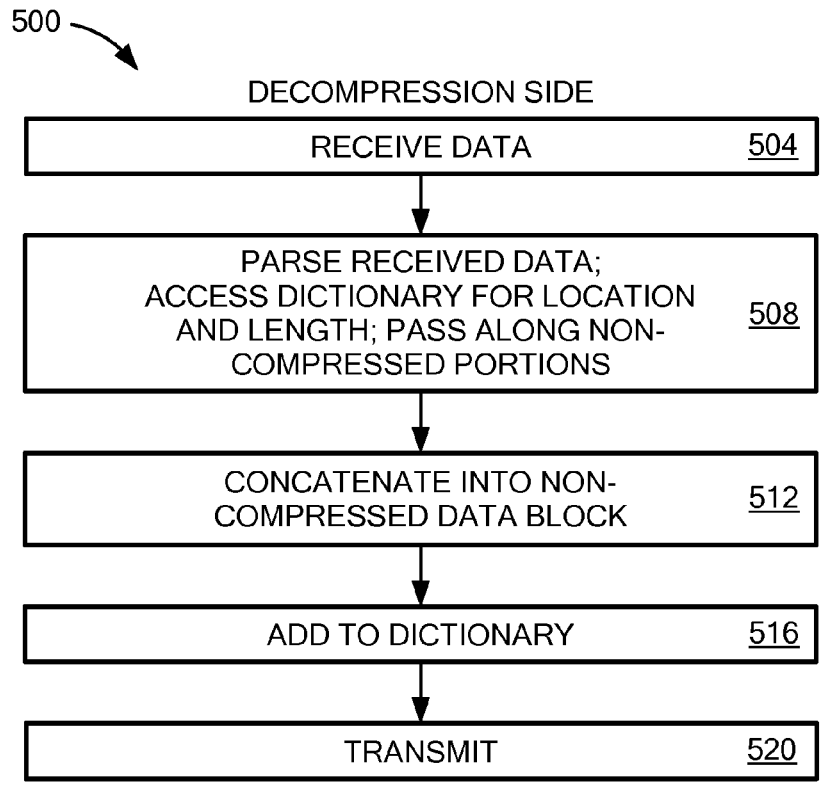
FIG. 5 is a block diagram of a decompressing method in accordance with an embodiment of the present invention.

Referring now to FIG. 5, a decompressing method 500 in accordance with an embodiment of the present invention begins at step 504 where the outgoing compressed data payload is received. At step 508 the received data payload is parsed, i.e., it is divided, to identify those portions that represent non-compressed data and those portions of the received payload that comprise pointers to the dictionary 412 and a corresponding length. The non-compressed data symbols are passed along and concatenated with data from the dictionary 412 that has been retrieved based on the pointer and length information, step 512, into a decompressed data payload. Subsequently, step 516, the non-compressed data payload is added to the dictionary 412 and then transmitted, step 520.

Synchronizing dictionaries, i.e., compression/decompression dictionaries, is well known to those of skill in the art. Thus, various mechanisms for doing so within the teachings of this specification are possible and can be implemented without undo experimentation.

In an embodiment described herein, the identification of the Nth and Mth symbols may be referred to as a "data independent" selection of a pattern. The present invention is not to be limited to data independent pattern selections and a "data dependent" selection rule may be used. Advantageously, in some instances a data dependent selection rule may reduce the data processing requirements. Thus, as a non-limiting example, a data dependent pattern selection rule could be one where an input data dictionary-index value is generated for "the pattern of input symbols where a sum of nine consecutive symbols is wholly divisible by 16." One of ordinary skill in the art will understand that there are many other types of data dependent and data independent selection rules that can be applied within the teachings of the present invention.

As will be appreciated by those skilled in the art, there are different ways of providing the compression information that would allow the receiving end to regenerate the original at least one group of symbols. For example, by indicating the symbols which constitute the first and last symbols of the group, or by indicating the starting point and the group length, or by indicating the end point and the group length, etc., all without departing from the scope of the present invention.

Although the data stream is referred to herein as belonging to a data type of signal, e.g., computer files, etc., still it should be understood to encompass, for example, data that belongs to signals of various types such as voice, video, etc., in a packetized form, that are treated as data.

As will be appreciated by those skilled in the art, embodiments of the present invention may implement lossless as well as lossy compression. Even though the example embodiment described herein teaches that non-compressible, i.e., non-matching, symbols are forwarded in their entirety as originally presented, indicating a lossless compression implementation, it should be understood that some of these symbols may be omitted, which in turn would lead to a lossy type of compression.

The embodiments of the present invention are applicable over a "packet switched communication network" that should be understood to encompass the various types of networks known in the art. These types of networks include, but are not limited to, synchronous and asynchronous transfer networks, for example, ATM networks, Ethernet networks, IP networks, frame relaying networks, Metropolitan Area Networks (MAN), Wide Area Networks (WAN), Local Area Network (LAN), packet over SONET/SDH networks, wireless networks and the like.

Additionally, embodiments of the present invention may be implemented in a packetized, i.e., a packet switched network, but it should be understood that the implementations are not limited to such networks and may be applied to other networks as well, e.g., TDM networks, without undue experimentation.

While the above-described embodiments generally depict a computer implemented system employing at least one processor executing program steps out of at least one memory to obtain the functions herein described, it should be recognized that the presently described methods may be implemented via the use of software, firmware or alternatively, implemented as a dedicated hardware solution such as in an application specific integrated circuit (ASIC) or via any other custom hardware implementation.

It is to be understood that the present invention has been described using non-limiting is detailed descriptions of embodiments thereof that are provided by way of example only and are not intended to limit the scope of the invention. Features and/or steps described with respect to one embodiment may be used with other embodiments and not all embodiments of the invention have all of the features and/or steps shown in a particular figure or described with respect to one of the embodiments. Variations of embodiments described will occur to persons of skill in the art.

It should be noted that some of the above described embodiments include structure, acts or details of structures and acts that may not be essential to the invention and which are described as examples. Structure and/or acts described herein are replaceable by equivalents that perform the same function, even if the structure or acts are different, as known in the art, e.g., the use of multiple dedicated devices to carry out at least some of the functions described as being carried out by the processor of the present invention. Therefore, the scope of the invention is limited only by the elements and limitations as used in the claims.

What is claimed is:

1. A computer-implemented method of compressing input data comprising a sequence of input data symbols, the method comprising:
   (a) copying a predetermined number of input data symbols into a defined block of input data symbols;
   (b) selecting a subset of input data symbols $S_N$ in the defined block of input data symbols according to a first predetermined selection rule;
   (c) generating a respective input data dictionary-index value $DI_N$ for the selected subset $S_N$;
   (d) if the input data dictionary-index value $DI_N$ represents a range of dictionary data symbols $D_N$ stored in a dictionary, then:
   (e) determining a range of input data symbols including the subset of input data symbols $S_N$ that matches a range of dictionary data symbols that includes the range of dictionary data symbols $D_N$; and
   (f) storing a correlation of the matching input data range of symbols and the dictionary data range of symbols, determined in step (e) as a set comprising a pointer to a starting symbol location in the dictionary and a matching range length;
   (g) selecting a next subset of input data symbols $S_N$ in the defined block of input data symbols according to the first predetermined selection rule; and
   (h) repeating steps (c)-(g) until an end of the defined block of input data symbols is reached; and
   converting the defined block of input data symbols into an outgoing data payload by replacing those input data symbols determined to be in a matching range of symbols in the dictionary in steps (b)-(h) with an indication of the stored corresponding pointer and matching range length.

2. The computer-implemented method of claim 1, wherein determining the range of matching input data symbols comprises:
   iteratively comparing different ranges of input data symbols including the respective subset of input data symbols $S_N$ to different ranges of dictionary data symbols that include the range of dictionary data symbols $D_N$.

3. The computer-implemented method of claim 1, further comprising:
searching a dictionary-index for an entry corresponding to the input data dictionary-index value $DI_N$, where each dictionary-index entry points to a range of dictionary data symbols D and its corresponding location in the dictionary.

4. The computer-implemented method of claim 3, further comprising:
defining a block of dictionary data symbols;
selecting a subset of dictionary data symbols in the defined block of dictionary data symbols according to a second predetermined selection rule different from the first predetermined selection rule and identifying its corresponding location in the dictionary;
calculating a dictionary-index value for the selected subset of dictionary data symbols; and
storing the calculated dictionary-index value and the corresponding dictionary location as an entry in the dictionary-index.

5. The computer-implemented method of claim 1, wherein:
selecting a subset of input data symbols $S_N$ comprises selecting an $N^{th}$ input data symbol $B_N$ in the defined block of input data symbols;
generating a respective input data dictionary-index value $DI_N$ comprises generating a respective input data hash value $HV_N$ for the selected input data symbol $B_N$; and
selecting a next subset of input data symbols $S_N$ comprises selecting a next $N^{th}$ input data symbol $B_N$ in the defined block of input data symbols.

6. The computer-implemented method of claim 5, wherein determining a range of input data symbols including the $N^{th}$ input data symbol $B_N$ that matches a range of dictionary data symbols that includes the dictionary data symbol $HB_N$ comprises:
terminating the determination when a length of the matching range is at least equal to a predetermined threshold value.

7. The computer-implemented method of claim 5, further comprising:
storing the correlation of the matching input data range of symbols and the dictionary data range of symbols as a set comprising a pointer to a starting symbol location in the dictionary and a matching range length only if a length of the matching input data range is greater than or equal to a predetermined minimum length.

8. The computer-implemented method of claim 5, further comprising:
searching a dictionary-index for an entry corresponding to the input data hash value $HV_N$, where each dictionary-index entry points to a range of dictionary data symbols HB and its corresponding location in the dictionary.

9. The computer-implemented method of claim 8, wherein the entries in the dictionary-index comprise hash values calculated for every $M^{th}$ symbol in the dictionary, wherein N≠M.

10. The computer-implemented method of claim 9, wherein N and M do not have a common factor value.

11. The computer-implemented method of claim 8, further comprising:
defining a block of dictionary data symbols;
selecting every $M^{th}$ symbol in the defined block of dictionary data symbols and identifying its corresponding location in the dictionary;
calculating a hash value $HV_M$ for each selected $M^{th}$ symbol; and
storing the calculated hash value $HV_M$ and the corresponding dictionary location as an entry in the dictionary-index,
wherein M ≠N.

12. The computer-implemented method of claim 11, wherein N and M do not have a common factor value.

13. The computer-implemented method of claim 8, wherein generating a respective input data hash value $HV_N$ comprises:
applying a hash function to the $N^{th}$ input data symbol $B_N$ and a predetermined number of adjacent input data symbols in the defined block of input data symbols.

14. The computer-implemented method of claim 13, wherein the predetermined number of adjacent input data symbols comprises a predetermined number of symbols immediately preceding the respective $N^{th}$ input data symbol $B_N$.

15. The computer-implemented method of claim 13, wherein determining the range of matching input data symbols comprises:
iteratively comparing different ranges of input data symbols including the respective input data symbol $B_N$ to different ranges of dictionary data symbols including the dictionary data symbol $HB_N$.

16. The computer-implemented method of claim 15, wherein iteratively comparing different ranges of input data symbols comprises:
creating different ranges of input data symbols and different ranges of dictionary data symbols by appending adjacent symbols.

17. An apparatus for compressing data, the apparatus comprising:
at least one memory having at least one computer program stored therein;
at least one processor operative to execute the at least one computer program out of the at least one memory to:
(a) receive a sequence of input data symbols;
(b) copy a predetermined number of the received input data symbols into a defined block of input data symbols;
(c) select a subset of input data symbols $S_N$ in the defined block of input data symbols according to a first predetermined selection rule;
(d) generate a respective input data dictionary-index value $DI_N$ for the selected subset of input data symbols $S_N$;
(e) if the dictionary-index value $DI_N$ represents a range of dictionary data symbols $D_N$ stored in a dictionary, then:
(f) determine a range of input data symbols including the subset of input data symbols $S_N$ that matches a range of dictionary data symbols that includes the range of dictionary data symbols $D_N$; and
(g) store a correlation of the matching input data range of symbols and the dictionary data range of symbols as a set comprising a pointer to a starting symbol location in the dictionary and a matching range length;
(h) select a next subset of input data symbols $S_N$ in the defined block of input data symbols according to the first predetermined selection rule;
(i) repeat steps (d)-(h) until an end of the defined block of input data symbols is reached; and
convert the defined block of input data symbols into an outgoing data payload by replacing those input data symbols determined to be in a matching range of symbols in the dictionary in steps (c)-(i) with an indication of the stored corresponding pointer and matching range length.

18. The apparatus of claim 17, wherein determining the range of matching input data symbols comprises:

is iteratively comparing different ranges of input data symbols including the respective subset of input data symbols $S_N$ to different ranges of dictionary data symbols that include the range of dictionary data symbols $D_N$.

19. The apparatus of claim 17, wherein:
selecting a subset of input data symbols $S_N$ comprises selecting an $N^{th}$ input data symbol $B_N$ in the defined block of input data symbols;
generating a respective input data dictionary-index value $DI_N$ comprises generating a respective input data hash value $HV_N$ for the selected input data symbol $B_N$; and
selecting a next subset of input data symbols $S_N$ comprises selecting a next $N^{th}$ input data symbol $B_N$ in the defined block of input data symbols.

20. The apparatus of claim 19, wherein determining a range of input data symbols including the $N^{th}$ input data symbol $B_N$ that matches a range of dictionary data symbols that includes the dictionary data symbol $HB_N$ comprises:
terminating the determination when a length of the matching range is at least equal to a predetermined threshold value.

21. The apparatus of claim 19, wherein the at least one processor is further operative to:
store the correlation of the matching input data range of symbols and the dictionary data range of symbols as a set comprising a pointer to a starting symbol location in the dictionary and a matching range length only if a length of the matching input data range is greater than or equal to a predetermined minimum length.

22. The apparatus of claim 19, wherein the at least one processor is further operative to:
search a dictionary-index for an entry corresponding to the input data dictionary-index value $DI_N$, where each dictionary-index entry points to a range of dictionary data symbols D and its corresponding location in the dictionary.

23. The apparatus of claim 22, wherein the at least one processor is further operative to:
define a block of dictionary data symbols;
select a subset of dictionary data symbols in the defined block of dictionary data symbols according to a second predetermined selection rule different from the first predetermined selection rule and identifying its corresponding location in the dictionary;
calculate a dictionary-index value for the selected subset of dictionary data symbols; and
store the calculated dictionary-index value and the corresponding dictionary location as an entry in the dictionary-index.

24. The apparatus of claim 19, wherein the at least one processor is further operative to:
search a dictionary-index for an entry corresponding to the input data hash value $HV_N$, where each dictionary-index entry points to a range of dictionary data symbols HB and its corresponding location in the dictionary.

25. The apparatus of claim 24, wherein the entries in the dictionary-index comprise hash values calculated for every $M^{th}$ symbol in the dictionary, wherein $N \neq M$.

26. The apparatus of claim 25, wherein N and M do not have a common factor value.

27. The apparatus of claim 24, wherein the at least one processor is further operative to:
define a block of dictionary data symbols;
select every $M^{th}$ symbol in the defined block of dictionary data symbols and identifying its corresponding location in the dictionary;
calculate a hash value $HV_M$ for each selected $M^{th}$ symbol; and
store the calculated hash value $HV_M$ and the corresponding dictionary location as an entry in the dictionary-index, wherein $M \neq N$.

28. The apparatus of claim 27, wherein N and M do not have a common factor value.

29. The apparatus of claim 24, wherein generating a respective input data hash value $HV_N$ comprises:
applying a hash function to the $N^{th}$ input data symbol $B_N$ and a predetermined number of adjacent input data symbols in the defined block of input data symbols.

30. The apparatus of claim 29, wherein the predetermined number of adjacent input data symbols comprises a predetermined number of symbols immediately preceding the respective $N^{th}$ input data symbol $B_N$.

31. The apparatus of claim 29, wherein determining the range of matching input data symbols comprises:
iteratively comparing different ranges of input data symbols including the respective input data symbol $B_N$ to different ranges of dictionary data symbols including the dictionary data symbol $HB_N$.

32. The apparatus of claim 31, wherein iteratively comparing different ranges of input data symbols comprises:
creating different ranges of input data symbols and different ranges of dictionary data symbols by appending adjacent symbols.

33. A computer-implemented method of compressing a sequence of input data symbols, the method comprising:
generating a respective input data dictionary-index value $DI_N$ for a subset of input data symbols $S_N$ in the sequence of input data symbols selected according to a first predetermined selection rule;
for each input data dictionary-index value $DI_N$:
searching a dictionary-index for an entry corresponding to each input data dictionary-index value $DI_N$, where each dictionary-index entry points to a range of dictionary data symbols D and a corresponding location in a dictionary;
if the input data dictionary-index value $DI_N$ is found in the dictionary-index then determining a range of input data symbols including the subset $S_N$ that matches a range of dictionary data symbols $D_N$; and
storing the correlation of the matching input data range of symbols and the dictionary data range of symbols as a set comprising a pointer to a starting symbol is location in the dictionary and a matching range length; and
for each input data symbol of the sequence of input data symbols:
inserting the input data symbol into an outgoing data payload if the input data symbol is not in a range of matching symbols in the dictionary; and
for those input data symbols in a matching range of symbols in the dictionary then inserting an indication of the stored corresponding pointer and matching range length in the outgoing data payload instead of the input data symbols.

34. The computer-implemented method of claim 33, further comprising:
defining a block of dictionary data symbols;
selecting a subset of dictionary data symbols in the defined block of dictionary data symbols according to a second predetermined selection rule different from the first predetermined selection rule and identifying its corresponding location in the dictionary;

calculating a dictionary-index value for the selected subset of dictionary data symbols; and storing the calculated dictionary-index value and the corresponding dictionary location as an entry in the dictionary-index.

35. The computer-implemented method of claim 33, wherein determining the range of matching input data symbols comprises:

iteratively comparing different ranges of input data symbols including the respective subset of input data symbols $S_N$ to different ranges of dictionary data symbols that include the range of dictionary data symbols $D_N$.

36. The computer-implemented method of claim 33, wherein:

selecting a subset of input data symbols $S_N$ comprises generating a respective input data hash value $HV_N$ for each $N^{th}$ input data symbol $B_N$ in the sequence of input data symbols, and wherein searching a dictionary-index comprises searching a hash index for an entry corresponding to each input data hash value $HV_N$, where each hash index entry points to a dictionary data symbol HB and its corresponding location in the dictionary.

37. The computer-implemented method of claim 36, wherein determining a range of input data is symbols including the $N^{th}$ input data symbol $B_N$ that matches a range of dictionary data symbols that includes the dictionary data symbol $HB_N$ comprises:

terminating the determination when a length of the matching range is at least equal to a predetermined threshold value.

38. The computer-implemented method of claim 36, further comprising:

storing the correlation of the matching input data range of symbols and the dictionary data range of symbols as a set comprising a pointer to a starting symbol location in the dictionary and a matching range length only if a length of the matching input data range is greater than or equal to a predetermined minimum length.

39. The computer-implemented method of claim 36, wherein the entries in the dictionary-index comprise hash values calculated for every $M^{th}$ symbol in the dictionary and wherein N≠M.

40. The computer-implemented method of claim 39, wherein N and M do not have a common factor value.

41. The computer-implemented method of claim 36, further comprising:

defining a block of dictionary data symbols;

selecting every $M^{th}$ symbol from the defined block of dictionary data symbols and identifying its corresponding location in the dictionary;

calculating a hash value $HV_M$ for each selected $M^{th}$ symbol; and storing the calculated hash value $HV_M$ and the corresponding dictionary location as an entry in the dictionary-index, wherein M≠N.

42. The computer-implemented method of claim 41, wherein N and M do not have a common factor value.

43. The computer-implemented method of claim 36, wherein generating a respective input data hash value $HV_N$ comprises:

applying a hash function to the $N^{th}$ input data symbol $B_N$ and a predetermined number of adjacent input data symbols in the sequence of input data symbols.

44. The computer-implemented method of claim 43, wherein the predetermined number of adjacent input data symbols comprises a predetermined number of symbols immediately preceding the respective $N^{th}$ input data symbol $B_N$.

45. The computer-implemented method of claim 43, wherein determining the range of matching input data symbols comprises:

iteratively comparing different ranges of input data symbols including the respective input data symbol $B_N$ to different ranges of dictionary data symbols including the dictionary data symbol $HB_N$.

46. The computer-implemented method of claim 45, wherein iteratively comparing different ranges of input data symbols comprises:

creating different ranges of input data symbols and different ranges of dictionary data symbols by appending adjacent symbols.

47. An apparatus for compressing data, the apparatus comprising:

at least one memory having at least one computer program stored therein;

at least one processor operative to execute the at least one computer program out of the at least one memory to:

receive sequence of input data symbols, generate a respective input data dictionary-index value $DI_N$ for a subset of input data symbol $S_N$ in the received sequence of input data symbols selected according to a first predetermined selection rule; and for each input data dictionary-index value $DI_N$:

search a dictionary-index for an entry corresponding to each input data dictionary-index value $DI_N$, where each dictionary-index entry points to a range of dictionary data symbols D and a corresponding location in a dictionary;

if the input data dictionary-index value $DI_N$ is found in the dictionary-index then determine a range of input data symbols including the subset $S_N$ that matches a range of dictionary data symbols $D_N$; and store the correlation of the matching input data range of symbols and the dictionary data range of symbols as a set comprising a pointer to a starting is symbol location in the dictionary and a matching range length; and for each input data symbol of the sequence of input data symbols:

insert the input data symbol into an outgoing data payload if the input data symbol is not in a range of matching symbols in the dictionary; and for those input data symbols in a matching range of symbols in the dictionary then insert an indication of the stored corresponding pointer and matching range length in the outgoing data payload instead of the input data symbols.

48. The apparatus of claim 47, wherein the at least one processor is further operative to:

define a block of dictionary data symbols;

select a subset of dictionary data symbols in the defined block of dictionary data symbols according to a second predetermined selection rule different from the first predetermined selection rule and identify its corresponding location in the dictionary;

calculate a dictionary-index value for the selected subset of dictionary data symbols; and store the calculated dictionary-index value and the corresponding dictionary location as an entry in the dictionary-index.

49. The apparatus of claim 47, wherein determining the range of matching input data symbols comprises:
  iteratively comparing different ranges of input data symbols including the respective subset of input data symbols $S_N$ to different ranges of dictionary data symbols that include the range of dictionary data symbols $D_N$.

50. The apparatus of claim 47, wherein:
  generating a respective input data dictionary-index value comprises generating a respective input data hash value $HV_N$ for each $N^{th}$ input data symbol $B_N$ in the received sequence of input data symbols, and
  wherein searching a dictionary-index for an entry corresponding to each input data dictionary-index value $DI_N$ comprises searching a hash index for an entry corresponding to each input data hash value $HV_N$, where each hash index entry points to a dictionary data symbol HB and a corresponding location in a dictionary.

51. The apparatus of claim 50, wherein determining a range of input data symbols including the $N^{th}$ input data symbol $B_N$ that matches a range of dictionary data symbols that includes the dictionary data symbol $HB_N$ comprises:
  terminating the determination when a length of the matching range is at least equal to a predetermined threshold value.

52. The apparatus of claim 50, wherein the at least one processor is further operative to:
  store the correlation of the matching input data range of symbols and the dictionary data range of symbols as a set comprising a pointer to a starting symbol location in the dictionary and a matching range length only if a length of the matching input data range is greater than or equal to a predetermined minimum length.

53. The apparatus of claim 50, wherein the entries in the dictionary-index comprise hash values calculated for every $M^{th}$ symbol in the dictionary and wherein N #M.

54. The apparatus of claim 53, wherein N and M do not have a common factor value.

55. The apparatus of claim 50, wherein the at least one processor is further operative to:
  retrieve a block of dictionary data symbols;
  select every $M^{th}$ symbol in the block of dictionary data symbols and identifying its corresponding location in the dictionary;
  calculate a hash value $HV_M$ for each selected $M^{th}$ symbol; and
  store the calculated hash value $HV_M$ and the corresponding location as an entry in the dictionary-index,
  wherein M≠N.

56. The apparatus of claim 55, wherein N and M do not have a common factor value.

57. The apparatus of claim 50, wherein generating a respective input data hash value $HV_N$ comprises:
  applying a hash function to the $N^{th}$ input data symbol $B_N$ and a predetermined number of adjacent input data symbols in the sequence of input data symbols.

58. The apparatus of claim 57, wherein the predetermined number of adjacent input data symbols comprises a predetermined number of symbols immediately preceding the respective $N^{th}$ input data symbol $B_N$.

59. The apparatus of claim 57, wherein determining the range of matching input data symbols comprises:
  iteratively comparing different ranges of input data symbols including the respective input data symbol $B_N$ to different ranges of dictionary data symbols including the dictionary data symbol $HB_N$.

60. The apparatus of claim 59, wherein iteratively comparing different ranges of input data symbols comprises:
  creating different ranges of input data symbols and different ranges of dictionary data symbols by appending adjacent symbols.

* * * * *